(12) United States Patent
Higgins

(10) Patent No.: US 7,187,160 B2
(45) Date of Patent: Mar. 6, 2007

(54) SYSTEMS AND METHODS FOR MEASURING AN RMS VOLTAGE

(76) Inventor: James C. Higgins, 1960 Doefield St., Canton, GA (US) 30115

( * ) Notice: Subject to any disclaimer, the term of this patent is extended or adjusted under 35 U.S.C. 154(b) by 36 days.

(21) Appl. No.: 11/189,318

(22) Filed: Jul. 26, 2005

(65) Prior Publication Data

US 2007/0024265 A1 Feb. 1, 2007

(51) Int. Cl.
*G01R 19/00* (2006.01)
*G06G 7/20* (2006.01)
*G06F 15/00* (2006.01)

(52) U.S. Cl. ............... 324/76.11; 327/348; 702/198
(58) Field of Classification Search ............ 324/76.11, 324/103 P, 105, 106, 522, 523, 722; 327/348; 702/198
See application file for complete search history.

(56) References Cited

U.S. PATENT DOCUMENTS

| | | | | |
|---|---|---|---|---|
| 4,786,859 A | * | 11/1988 | Arseneau et al. ............ 324/98 |
| 5,164,660 A | * | 11/1992 | Carl, Jr. ..................... 324/132 |
| 5,189,283 A | * | 2/1993 | Carl et al. ................... 219/497 |
| 5,189,362 A | * | 2/1993 | Doble ......................... 324/106 |
| 5,473,244 A | * | 12/1995 | Libove et al. ............... 324/126 |
| 5,644,238 A | * | 7/1997 | Seifert et al. ............... 324/424 |
| 5,691,644 A | * | 11/1997 | Danilyak .................... 324/543 |
| 6,392,402 B1 | * | 5/2002 | Swift .......................... 324/132 |
| 6,469,492 B1 | * | 10/2002 | Britz .......................... 324/132 |
| 6,668,232 B2 | * | 12/2003 | Ennis et al. .................. 702/60 |
| 2006/0125494 A1 | * | 6/2006 | Von Hagen ................. 324/722 |

* cited by examiner

*Primary Examiner*—Andrew H. Hirshfeld
*Assistant Examiner*—Hoai-An D. Nguyen
(74) *Attorney, Agent, or Firm*—Paparella & Associates

(57) ABSTRACT

An embodiment of a method for measuring an RMS voltage of an arbitrary time-varying waveform includes: a) coupling said arbitrary time-varying waveform to said thermally sensitive device; b) decoupling said arbitrary time-varying waveform from said thermally sensitive device; c) coupling said thermally sensitive device to said controlled DC voltage source; d) measuring a current through said thermally sensitive device at least two points in time; e) determining a change in said current over said at least two points in time; f) if said current is increasing between said at least two points in time, then decrease said controlled DC voltage source responsive to determining that said current is increasing; g) if said current is decreasing between said at least two points in time, then increase said controlled DC voltage source responsive to determining that said current is decreasing; and h) repeating steps a)–g).

16 Claims, 7 Drawing Sheets

SYSTEMS AND METHODS FOR MEASURING AN RMS VOLTAGE

BACKGROUND

RMS stands for root of the mean of the square and is a standard for measuring arbitrary time-varying waveforms. Currently, there are three primary methods for measuring an RMS voltage. The first method employs a peak detector and an averaging circuit that scales the average value to equal the RMS voltage. However, this method yields inaccurate results especially for non-sine wave arbitrary time-varying signals. The second method employs a computational method with either analog computation using log diodes or digital computation using dedicated hardware. This method has difficulty with linearity and crest factor accuracy. A third method employs a thermal method of measurement that typically uses balanced thermal sensors. This method is accurate and it can handle a wide frequency range and crest factor. However, this thermal method may be difficult to implement, delicate, expensive, and slow. Therefore there exists a need for systems and methods that address these and/or problems associated with existing thermal methods of measuring RMS voltage. For example, there exists a need for more cost effective systems and methods for accurately measuring RMS voltages.

SUMMARY

Systems and methods for measuring an RMS voltage value using a thermally sensitive device are provided. An embodiment of a method for measuring an RMS voltage of an arbitrary time-varying waveform includes: a) coupling said arbitrary time-varying waveform to said thermally sensitive device; b) decoupling said arbitrary time-varying waveform from said thermally sensitive device, c) coupling said thermally sensitive device to said controlled DC voltage source; d) measuring a current through said thermally sensitive device at least two points in time; e) determining a change in said current over said at least two points in time; f) if said current is increasing between said at least two points in time, then decrease said controlled DC voltage source responsive to determining that said current is increasing; g) if said current is decreasing between said at least two points in time, then increase said controlled DC voltage source responsive to determining that said current is decreasing; and h) repeating steps a)–g).

An embodiment of an RMS measurement circuit includes: a resistance selection circuit coupled to a controlled DC voltage source circuit and to a current measurement circuit; a microcontroller coupled to said controlled DC voltage source circuit and to said current measurement circuit; wherein said resistance selection circuit comprises: an input of a arbitrary time-varying waveform coupled to a first switch; a controlled DC voltage source coupled to a second switch; a thermally sensitive device coupled to said first and second switches; and wherein said current measurement circuit is configured to measure said current through said thermally sensitive device.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

As will be described in greater detail herein, systems and method(s) for measuring an RMS amplitude of an unknown time-varying waveform are disclosed. RMS is mathematically the root of the mean of the square of a waveform and is equal to the heating value of a waveform. Systems and method(s) are disclosed for a thermal method to measure RMS.

A system and method(s) are provided for measuring the RMS voltage of an unknown time-varying waveform ("unknown source") by converting the RMS of the unknown source to a DC voltage value equal to the RMS value of the unknown source. Systems and method(s) for an RMS measurement system comprise an unknown source, a controlled DC voltage value ("DC voltage mirror"), a thermally sensitive device (e.g., negative temperature coefficient thermistor) for measurement, a selection system to toggle between the sources, and a microcontroller to take measurements and to apply the feedback system. The thermally sensitive device is switched between the unknown source and the DC voltage mirror. The switch normally connects the unknown source to the thermally sensitive device causing a certain power to dissipate equal to the square of the voltage divided by the resistance of the thermally sensitive device. The switch is then momentarily switched to the DC voltage mirror and the DC current value is measured and recorded. Over a brief interval, the DC current value is measured again to see if it is increasing or decreasing. If the measured current with the DC voltage mirror is decreasing it indicates the thermally sensitive device is cooling, and then the DC voltage mirror value is less than the applied RMS of the unknown source. To compensate and bring the DC voltage mirror value closer to the RMS, the DC voltage mirror value is increased. Alternatively, if the current is increasing it indicates the DC voltage mirror is higher than the RMS and the DC voltage mirror value is decreased. This process continues in a feedback loop until the current change is zero. At this point, the DC voltage mirror value equals the RMS value of the unknown source and the value may be provided by an analog output or a digital output. The microcontroller may be configured to control the selection of the sources, take the current measurements, record the current values, compute the difference in current values, adjust the DC voltage mirror, and repeat the process.

Figure 1:
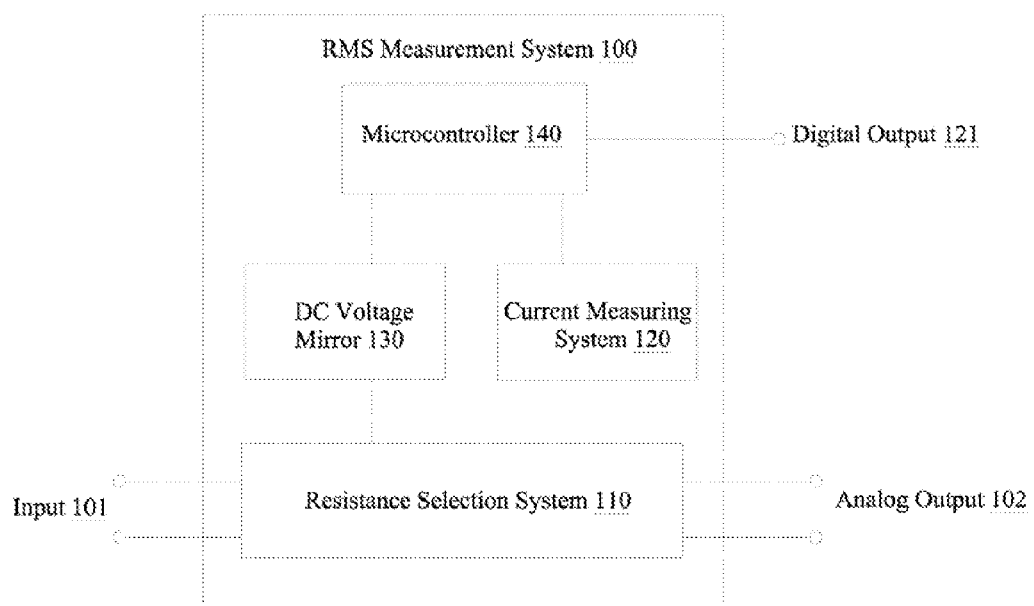
FIG. 1 is a block diagram depicting an embodiment of an RMS measurement system.

Referring now to the drawings, FIG. 1 is a block diagram depicting an embodiment of an RMS measurement system 100. The RMS measurement system 100 comprises an input 101, a resistance selection system 110, a current measuring system 120, a DC voltage mirror 130, a microcontroller 140, an analog output 102, and a digital output 111. The DC voltage mirror 130 comprises a controlled DC voltage source. The resistance selection system 110 comprises a thermally sensitive device (e.g., negative temperature coefficient thermistor) which may be switched between the input 101 of an unknown source and the DC voltage mirror 130. The thermally sensitive device (e.g., thermistor) may have a resistance which varies in a non-linear fashion as a function of temperature. Each voltage across the thermally sensitive device represents a unique temperature and equal voltages across the thermally sensitive device will result in the same resistance of the thermally sensitive device. The resistance selection system 110 is configured to switch the thermally sensitive device between an unknown source on the input 101 and the DC voltage mirror 130. The current measuring system 120 comprises circuitry which is configured to measure a current value through the thermally sensitive device, and store the value in the microcontroller 140 (e.g., converting analog current value with an analog-to-digital converter and providing to microcontroller input). The microcontroller 140 is configured to control the resistance selection system 110, to store the current values from the current measuring system 120, to determine if the current values are changing, to adjust the DC voltage mirror 130 value, and to continue until the DC voltage mirror 130 value converges with the RMS value. The current measuring system 120 is configured to measure the current through the thermally sensitive device in the resistance selection system 110 while the DC voltage mirror 130 is connected. The RMS measurement system may provide an analog output 102 which provides the DC voltage mirror value and may be connected to the resistance selection system 110. Additionally, the microcontroller 140 may provide a digital output 121 which may provide a digital value of the DC voltage mirror value.

Figure 2A:
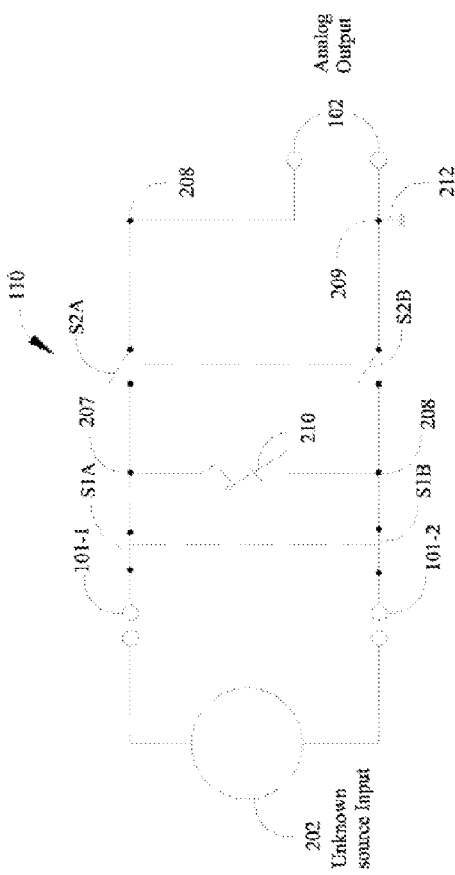
FIGS. 2A–2B are example circuit diagrams of a resistance selection system for an RMS measurement system.
Figure 2B:
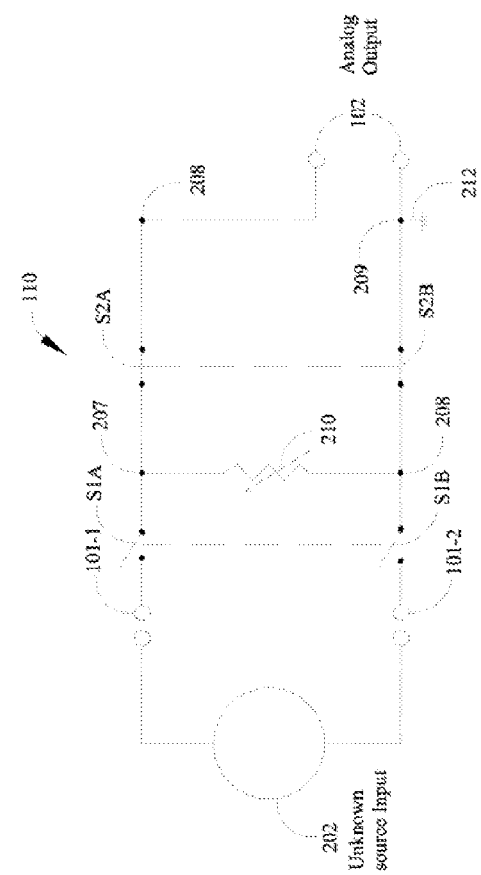

FIGS. 2A–2B are example circuit diagrams of a resistance selection system 110 for an RMS measurement system 100. The resistance selection system 110 comprises an input 101, a switch S1A and S1B, a switch S2A and S2B, a thermistor 210, and an analog output 102. An unknown source input 202 may be attached to the input 101 of the resistance selection system 110. The thermistor 210 is an example of a thermally sensitive device with the resistance varying as a function of voltage. The thermistor 210 is connected to the switch S1A and S1B and to the switch S2A and S2B via a junction 207 and a junction 208. The switch S1A and S1B connects the unknown source input 202 to the thermistor 210 when closed as depicted in FIG. 2A. The switch S2A and S2B connects the DC voltage mirror 130 (not shown) to the thermistor 210 when closed as depicted in FIG. 2B. An electrical ground 212 is connected to the circuit at junction 209, and a current measuring system 120 (not shown), a DC voltage mirror 130 (not shown), and microcontroller 140 (not shown) may connect to the resistance selection system 110 at the junction 208. The microcontroller 140 (not shown) may operate the switch S1A and S1B and the switch S2A and S2B to alternate connecting the unknown source input 202 to the thermistor 210 and connecting the DC voltage mirror 130 (not shown) to the thermistor 210.

Figure 3:
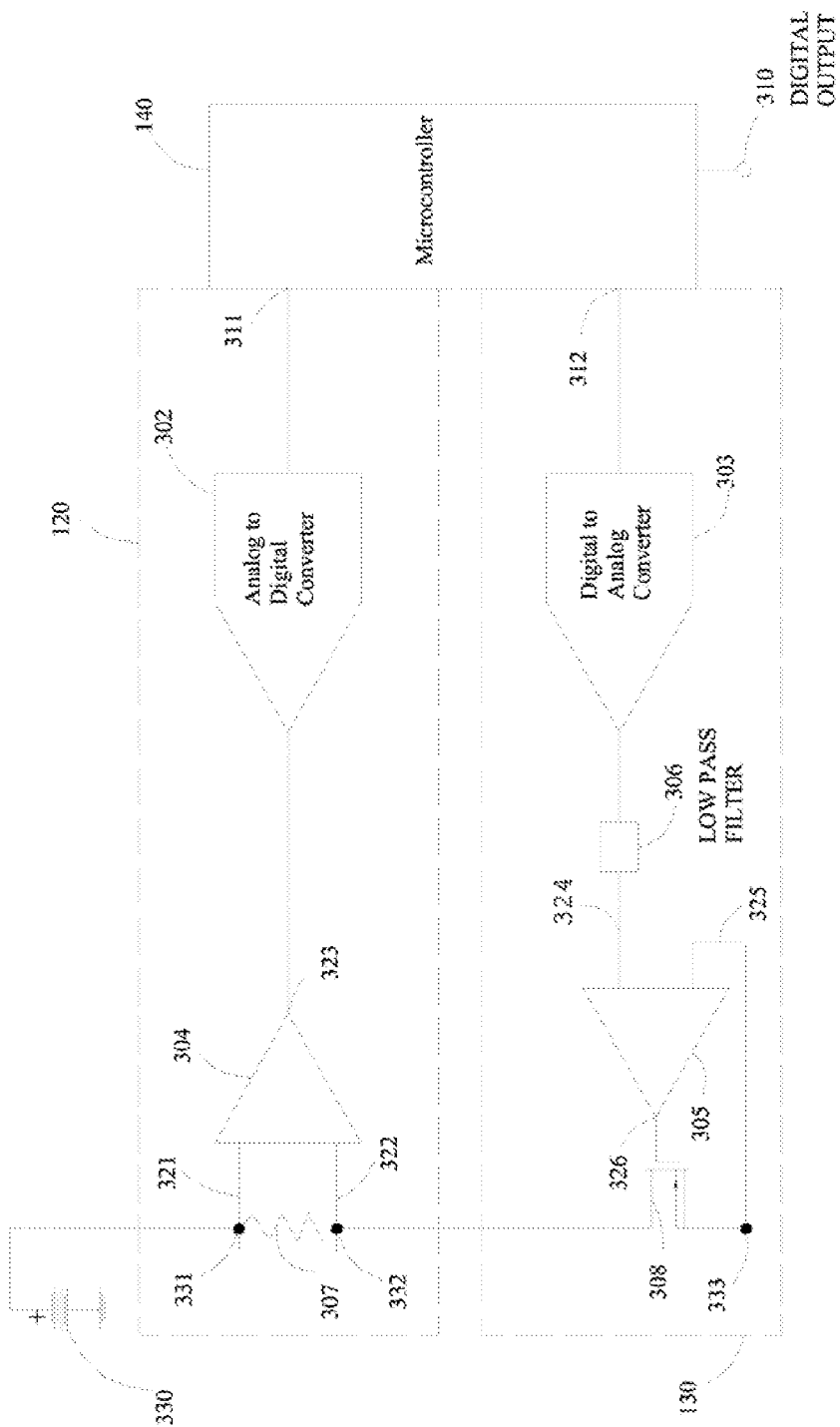
FIG. 3 is an example circuit diagram of a current measuring system, a DC voltage mirror, and a microcontroller for an RMS measurement system.

FIG. 3 is an example circuit diagram of a current measuring system 120, a DC voltage mirror 130, and a microcontroller 140 for an RMS measurement system 100. The current measuring system 120 comprises a resistor 307, an analog-to-digital converter 302, and a differential amplifier 304. The DC voltage mirror comprises an operational amplifier 305, a low-pass filter 306, a digital-to-analog converter 303, and a transistor 308. The microcontroller 140 comprises a digital input 311, a-digital output 312, and a digital output 310. The current measuring system 120 is configured to measure the voltage across the resistor 307 with the differential amplifier 304 and to convert this voltage representing the current value with the analog-to-digital converter 302. The differential amplifier 304 is configured to have its inputs 321 and 322 in a parallel connection with the resistor 307 at a junction 331 and a junction 332. The voltage value across resistor 307 changes according to the resistance of the thermistor 210 (not shown) in FIGS. 2A and 2B. The current measuring system 120 provides a digital value for the current through resistor 307 to the input 311 of the microcontroller 140. The microcontroller 140 may be programmed to store the current value received at input 311 and to compare this value to subsequent values. The microcontroller 140 may be, for example, a Motorola 6811© or an Intel 8051©. The microcontroller 140 may use various feedback algorithms such as, for example, a Proportional Integral Derivative (PID) to provide rapid response times to changing current values. The microcontroller 140 is configured to provide the DC voltage mirror 130 value on the output 312. The output 312 is connected to a digital-to-analog converter 303. The output of the digital-to-analog converter 303 may be connected to a low-pass filter 306 to improve the accuracy of the DC voltage mirror 130 value by using an averaging technique of the DC voltage mirror 130 value. The output of the low-pass filter 306 is connected to a non-inverting input 324 of the operational amplifier 305. An inverting input 325 of the operational amplifier 305 is connected in a feedback loop to a junction 333 which in turn is connected to a transistor 308 at the output of the operational amplifier 305. The DC voltage mirror 130 value is provided at junction 333. The microcontroller 140 may have an output 310 which provides a digital output of the DC voltage mirror 130, which will equal the RMS value of the unknown source when the current values are no longer changing. A power source 330 may be connected to the current measuring system 120 at a junction 331. The junction 333 may connect to a junction 208 (not shown) on the resistance selection system 110 (not shown) in FIGS. 2A and 2B.

Figure 4:
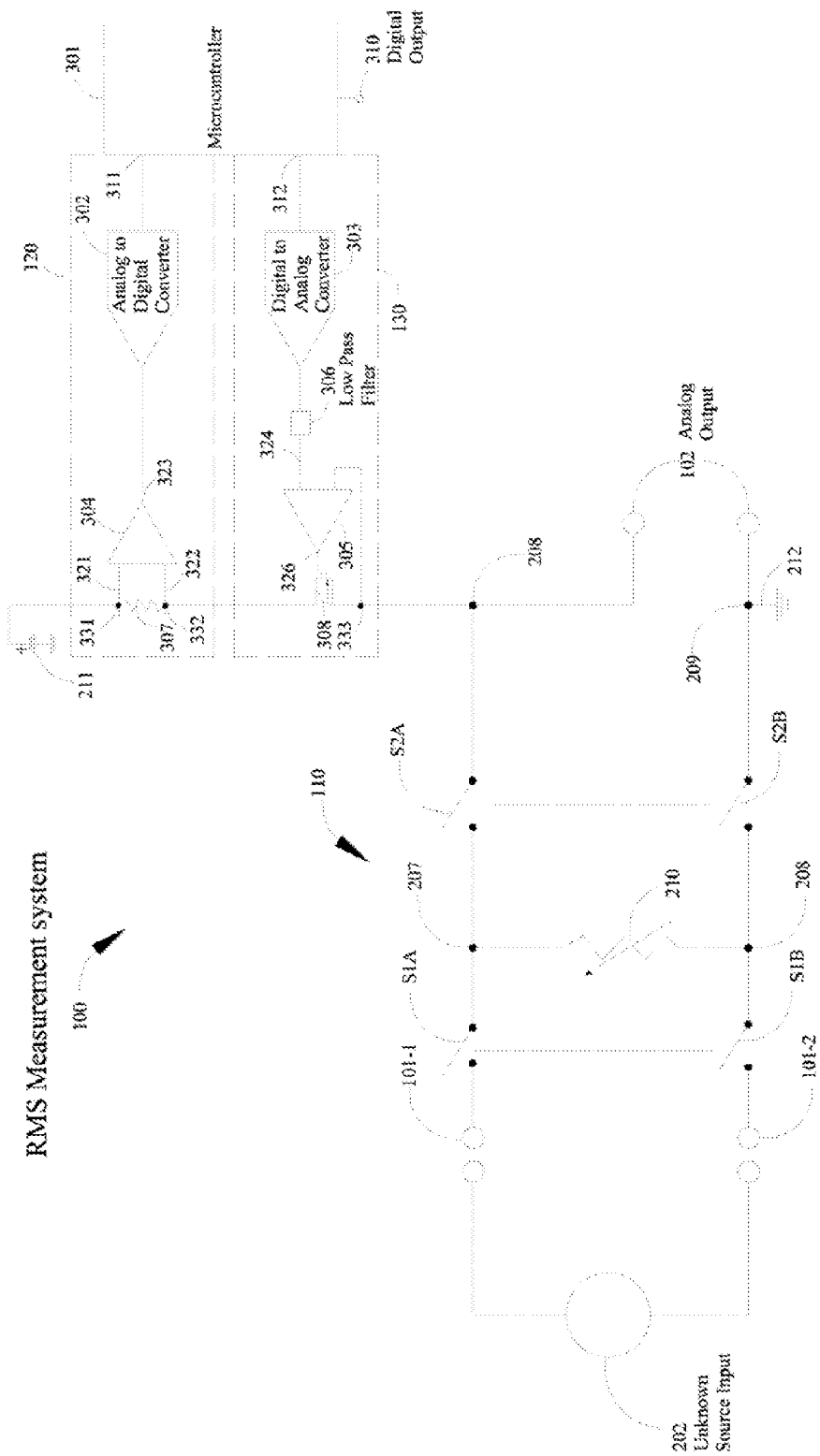
FIG. 4 is an example circuit diagram of a current measurement system.

FIG. 4 is an example circuit diagram of an RMS measurement system 100. The RMS measurement system 100 comprises a resistance selection system 110, a current measuring system 120, a DC voltage mirror 130, and a microcontroller 140. The resistance selection system 110 is depicted in FIGS. 2A and 2B. The current measuring system 120, the DC voltage mirror 130, and the microcontroller 140 are depicted in FIG. 3. The resistance selection system 110 is connected at junction 208 to the current measuring system 120 at junction 333. The DC voltage mirror value is provided at junction 333.

Figure 5:
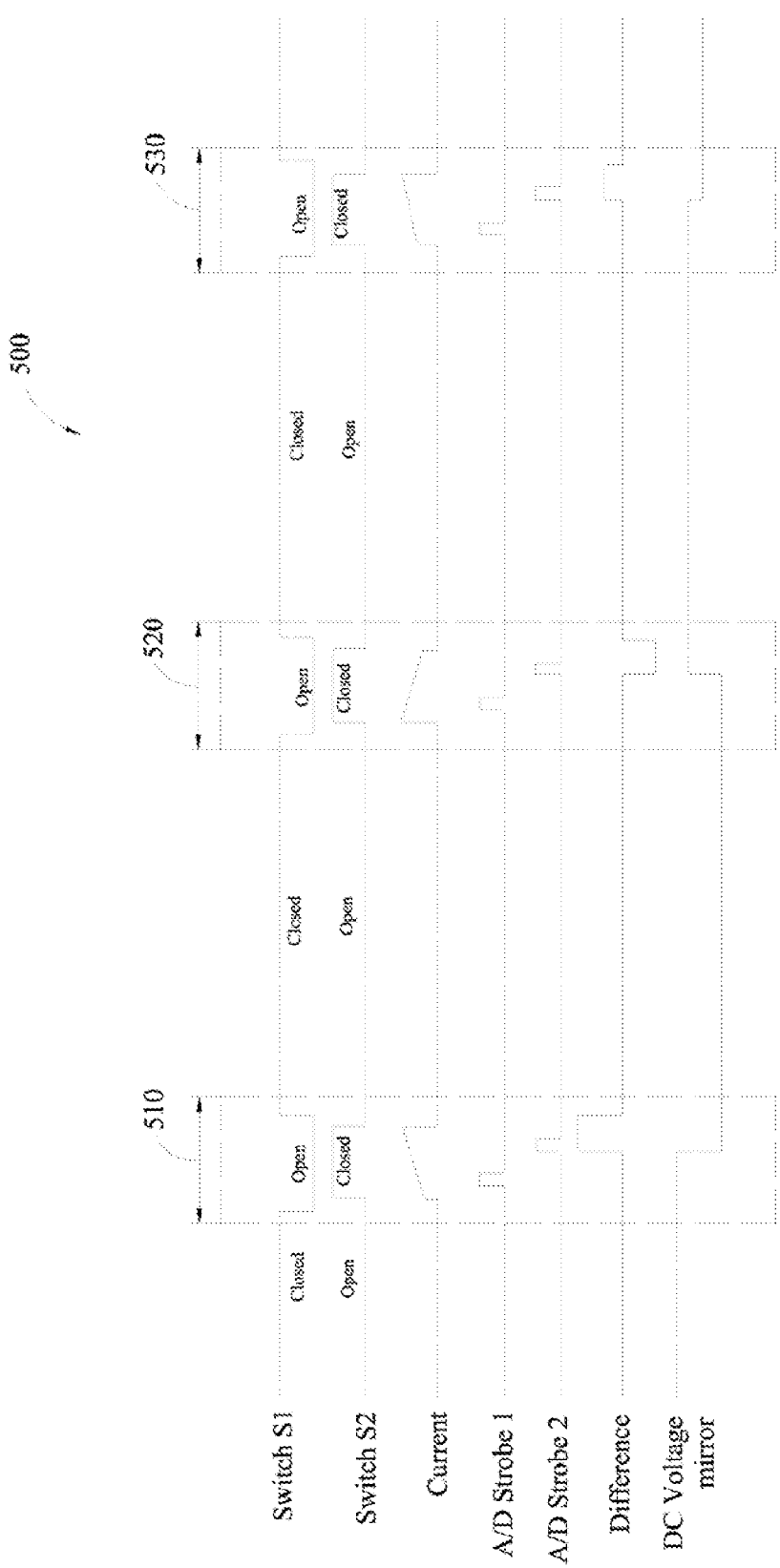
FIG. 5 is an example timing diagram of an RMS measurement system.

FIG. 5 is an example timing diagram 500 of an RMS measurement system 100. The timing diagram 500 depicts three operations 510, 520, and 530 of an RMS measurement system to measure the RMS value of an unknown source. The timing diagram 500 comprises the switch S1 which connects an unknown source to a thermistor, the switch S2 which connects a DC voltage mirror to the thermistor, a current feedback which is the change in current while the DC voltage mirror is connected to the thermistor, an A/D strobe 1 and 2 where the microcontroller takes the current measurement, a difference which shows whether the current is decreasing or increasing, and the DC voltage mirror value which is adjusted according to whether the current is decreasing or increasing. In operation 510, the switch S1 is initially closed to connect the unknown source to the thermistor. Switch S1 is then opened and Switch S2 is closed to connect the DC voltage mirror to the thermistor. The current through the thermistor is increasing which indicates the DC voltage mirror value is greater than the RMS value of the unknown source. The A/D strobes twice at different times and the difference in current value is recorded in the microcontroller. The microcontroller decreases the DC voltage mirror value because the difference is positive, and opens switch S2 and closes switch S1 to connect the unknown source to the thermistor for another operation. The operation 520 begins with switch S1 initially closed to connect the unknown source to the thermistor. Switch S1 is then opened and switch S2 is closed to connect the DC voltage mirror to the thermistor. The current through the thermistor is decreasing which indicates the DC voltage mirror value is less than the RMS value of the unknown source. The A/D strobes twice at different times and the difference in current value is recorded in the microcontroller. The microcontroller increases the DC voltage mirror value because the difference is negative, and opens switch S2 and closes switch S1 to connect the unknown source to the thermistor for another operation. The operation 530 begins with switch S1 initially closed to connect the unknown source to the thermistor. Switch S1 is then opened and switch S2 is closed to connect the DC voltage mirror to the thermistor. The current through the thermistor is increasing which indicates the DC voltage mirror value is greater than the RMS value of the unknown source. The A/D strobes twice at different times and the difference in current value is recorded in the microcontroller. The microcontroller decreases the DC voltage mirror value because the difference is positive, and opens switch S2 and closes switch S1 to connect the unknown source to the thermistor for another operation.

Figure 6:
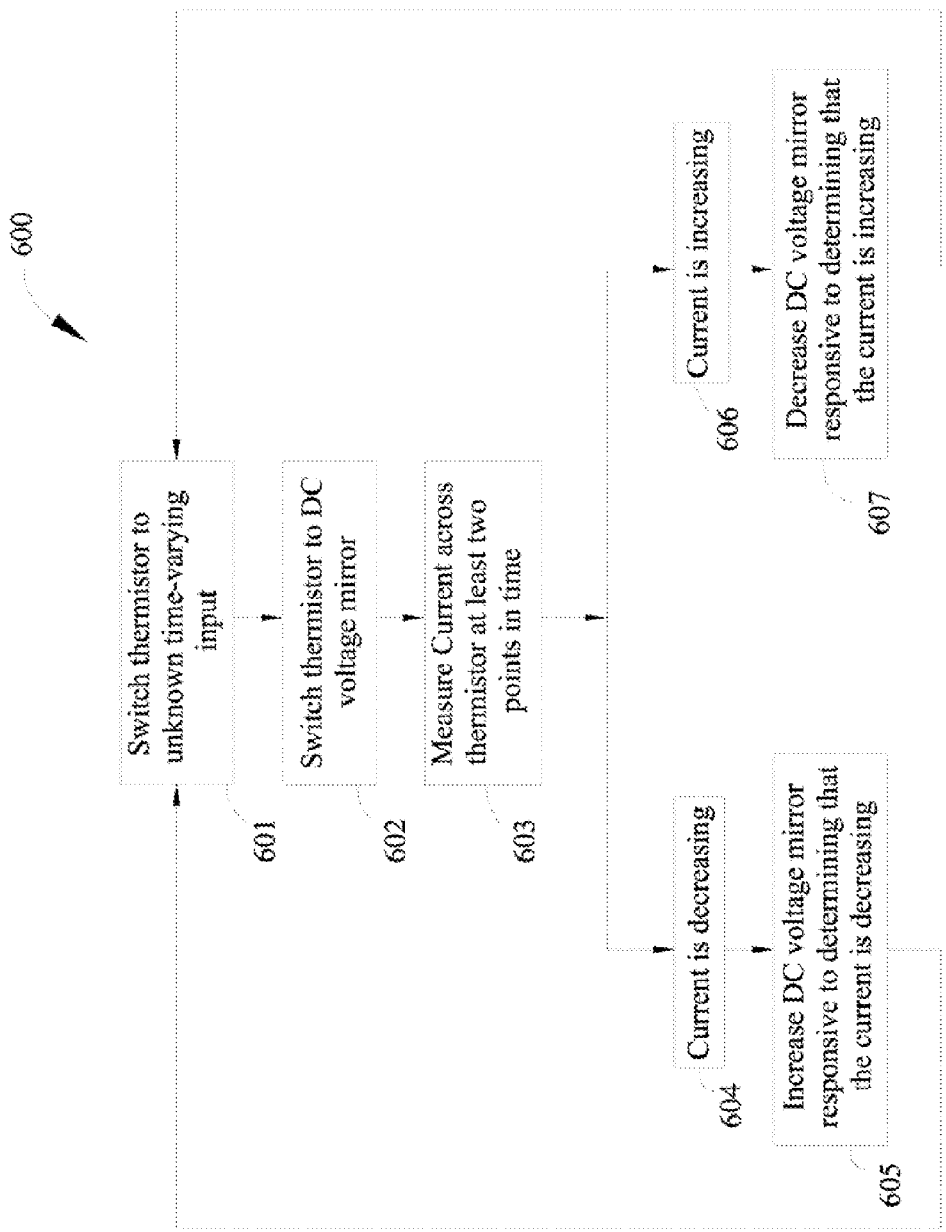
FIG. 6 is a method for measuring an RMS voltage value of an unknown time-varying waveform with an RMS measurement system.

FIG. 6 is a method 600 for measuring an RMS voltage value of an unknown time-varying waveform with an RMS measurement system 100. The method 600 comprises switching a thermistor to the unknown source (step 601); switching the thermistor to a DC voltage mirror (step 602); and measuring the current through the thermistor during at least two points in time (step 603). The method 600 comprises a feedback loop that will cause the voltage mirror to substantially converge with the RMS voltage value. If the current is decreasing (step 604), then the resistance of the thermistor is increasing and the temperature is decreasing indicating the DC voltage mirror value is less than the RMS voltage of the unknown source. The DC voltage mirror value is increased responsive to determining that the current is decreasing (step 605). If the current is increasing (step 606), then the resistance of the thermistor is decreasing and the temperature is increasing indicating the DC voltage mirror value is greater than the RMS voltage of the unknown source. The DC voltage mirror value is decreased responsive to determining that the current is increasing (step 607).

Figure 7:
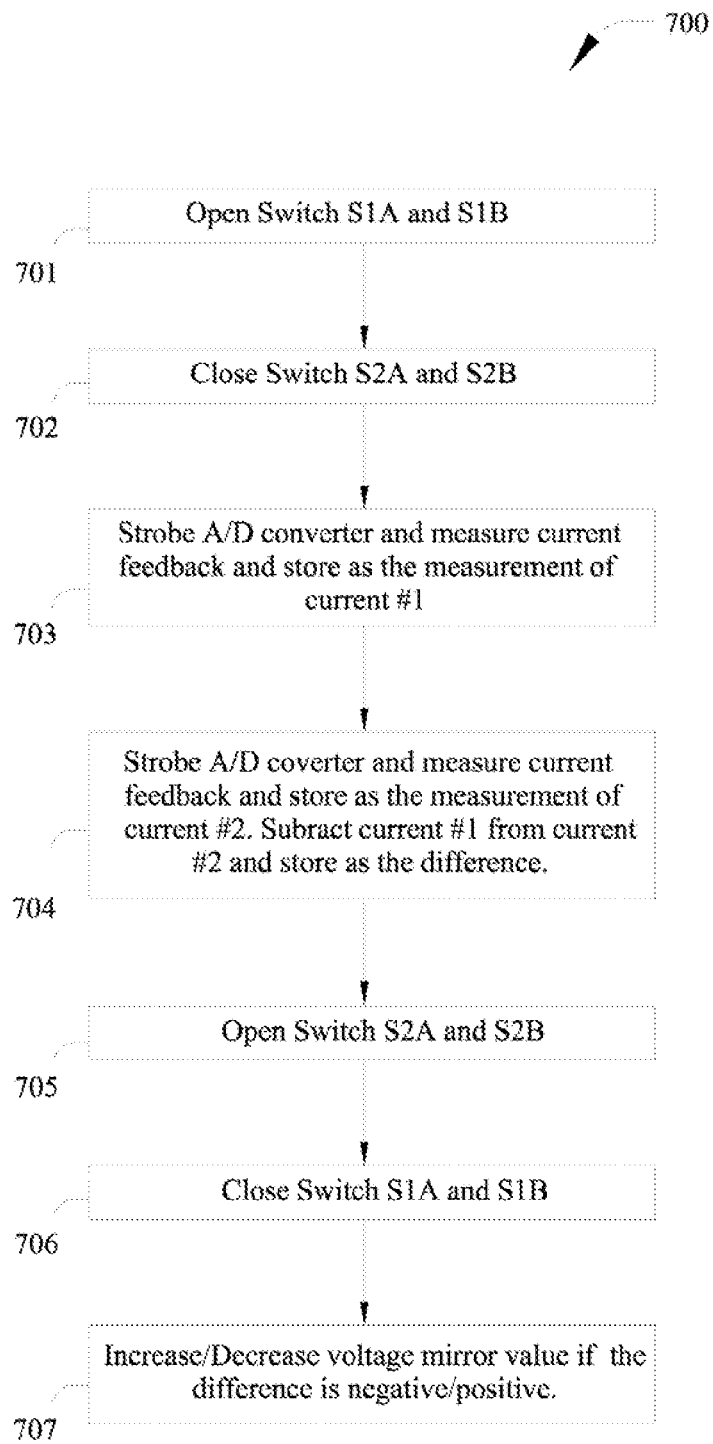
FIG. 7 is an example method of an operation of an RMS measurement system.

FIG. 7 is an example method 700 of an operation of an RMS measurement system 100. The method 700 comprises opening of a switch S1A and S1B (step 701); closing of a switch S2A and S2B (step 702); strobing of an A/D converter and measuring the current feedback and storing this value as a measurement of current #1 in a microcontroller (step 703); strobing of the A/D converter and measuring the current feedback and storing this value as a measurement of current #2, and subtracting the measurement of current #1 from the measurement current #2 and storing as the difference (step 704); opening of the switch S2A and S2B (step 705); closing of the switch S1A and S1B (step 706); and increasing/decreasing the voltage mirror if the difference is negative/positive (step 707).

It should be emphasized that the above-described embodiments of the present invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and present invention.

The invention claimed is:

1. A method for measuring an RMS voltage of an arbitrary time-varying waveform provided with a thermally sensitive device and a controlled DC voltage source, the method comprising:
   a) coupling the arbitrary time-varying waveform to the thermally sensitive device;
   b) decoupling the arbitrary time-varying waveform from the thermally sensitive device;
   c) coupling the thermally sensitive device to the controlled DC voltage source;
   d) measuring a current through the thermally sensitive device at least two points in time;
   e) determining a change in the current over the at least two points in time;
   f) if the current is increasing between the at least two points in time, then decrease the controlled DC voltage source responsive to determining that the current is increasing;
   g) if the current is decreasing between the at least two points in time, then increase the controlled DC voltage source responsive to determining that the current is decreasing;
   h) repeating steps a)–g) until the current change is equal to a predetermined value; and
   i) outputting DC voltage source value, which equal to RMS value of the arbitrary time-varying waveform, when the current change is equal to the predetermined value.

2. The method of claim 1, wherein said RMS voltage measurement is implemented by an RMS measurement circuit comprising:
   a resistance selection circuit coupled to a controlled DC voltage source circuit and to a current measurement circuit; and
   a microcontroller coupled to said controlled DC voltage source circuit and to said current measurement circuit;
   wherein said resistance selection circuit comprises:
      an input of a arbitrary time-varying waveform coupled to a first switch;
      a controlled DC voltage source coupled to a second switch;
      a thermally sensitive device coupled to said first and second switches; and
   wherein said current measurement circuit is configured to measure said current through said thermally sensitive device.

3. The method of claim 2, wherein said resistance selection circuit electrically isolates said arbitrary time-varying waveform and said controlled DC voltage source with said first and second switches coupled to said thermally sensitive device.

4. The method of claim 2, wherein said thermally sensitive device is a negative temperature coefficient thermistor.

5. The method of claim 2, wherein said controlled DC voltage circuit comprises:
   a digital-to-analog converter input coupled to a microcontroller output;
   an operational amplifier with one input coupled to said digital-to-analog converter output and one input coupled in feedback with said operational amplifier output; and
   a transistor coupled to said operational amplifier output.

6. The method of claim 5, wherein a low-pass filter is coupled between said digital-to-analog converter output and said operational amplifier input configured to increase accuracy of said digital-to-analog output.

7. The method of claim 2, wherein said current measurement circuit comprises:
   a resistor;
   a differential amplifier;
   an analog-to-digital converter; and
   a microcontroller;
   wherein said resistor is coupled in parallel with inputs of said differential amplifier;
   wherein an output of said differential amplifier is coupled to an input of an analog-to-digital converter; and
   wherein an output of said analog-to-digital converter is coupled to an input of said microcontroller.

8. The method of claim 2, wherein said microcontroller is configured to:
   control said first and second switch;
   store outputs from said current measurement circuit;
   compare outputs from said current measurement circuit;
   provide said controlled DC voltage source value to said controlled DC voltage source circuit;
   adjust said controlled DC voltage source value responsive said current value; and
   provide a digital output of said controlled DC voltage source value.

9. An RMS measurement circuit comprises:
   a resistance selection circuit coupled to a controlled DC voltage source circuit and to a current measurement circuit;
   a microcontroller coupled to the controlled DC voltage source circuit and to the current measurement circuit;
   wherein the resistance selection circuit comprises:
      an input of an arbitrary time-varying waveform coupled to a first switch;
      a controlled DC voltage source coupled to a second switch;
      a thermally sensitive device coupled to the first and second switches;
   wherein the current measurement circuit is configured to measure the current through the thermally sensitive device at least two points in time;
   wherein the microcontroller is configured to control the controlled DC voltage source circuit to either decrease the controlled DC voltage source responsive to determining that the current is increasing between the at least two points in time, or increase the controlled DC voltage source responsive to determining that the current is decreasing between the at least two points in time; and
   outputting means for outputting DC voltage source value, which equal to RMS value of the arbitrary time-varying waveform, when a change in the current over the at least two points in time is equal to a predetermined value.

10. The RMS measurement circuit of claim 9, wherein said resistance selection circuit electrically isolates said arbitrary time-varying waveform and said controlled DC voltage source with said first and second switches coupled to said thermally sensitive device.

11. The RMS measurement circuit of claim 9, wherein said thermally sensitive device is a negative temperature coefficient thermistor.

12. The RMS measurement circuit of claim 10, wherein said controlled DC voltage circuit comprises:
   a digital-to-analog converter input coupled to a microcontroller output;
   an operational amplifier with one input coupled to said digital-to-analog converter output and one input coupled in feedback with said operational amplifier output; and
   a transistor coupled to said operational amplifier output.

13. The RMS measurement circuit of claim 12, wherein a low-pass filter is coupled between said digital-to-analog converter output and said operational amplifier input configured to increase accuracy of said digital-to-analog output.

14. The RMS measurement circuit of claim 9, wherein said current measurement circuit comprises:
   a resistor;
   a differential amplifier;
   an analog-to-digital converter; and
   a microcontroller;
   wherein said resistor is coupled in parallel with inputs of said differential amplifier;
   wherein an output of said differential amplifier is coupled to an input of an analog-to-digital converter; and
   wherein an output of said analog-to-digital converter is coupled to an input of said microcontroller.

15. The RMS measurement circuit of claim 9, wherein said microcontroller is configured to:
   control said first and second switch;
   store outputs from said current measurement circuit;
   compare outputs from said current measurement circuit;
   provide said controlled DC voltage source value to said controlled DC voltage source circuit;
   adjust said controlled DC voltage source value responsive to measurement system; and
   provide a digital output of said controlled DC voltage source value.

16. The RMS measurement circuit of claim 15, wherein said microcontroller implements a Proportional Integral Derivative (PID) feedback algorithm to increase response time.

* * * * *